(12) United States Patent  
Turner et al.

(10) Patent No.: US 7,491,622 B2
(45) Date of Patent: Feb. 17, 2009

(54) PROCESS OF FORMING AN ELECTRONIC DEVICE INCLUDING A LAYER FORMED USING AN INDUCTIVELY COUPLED PLASMA

(75) Inventors: Michael D. Turner, San Antonio, TX (US); Mohamad M. Jahanbani, Austin, TX (US); Toni D. Van Gompel, Austin, TX (US); Mark D. Hall, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 228 days.

(21) Appl. No.: 11/409,790

(22) Filed: Apr. 24, 2006

(65) Prior Publication Data

US 2007/0249160 A1    Oct. 25, 2007

(51) Int. Cl.
*H01L 21/76* (2006.01)
*H01L 23/58* (2006.01)
(52) U.S. Cl. ............................ 438/438; 257/647
(58) Field of Classification Search ......... 257/647–649; 438/426, 437, 444, 792
See application file for complete search history.

(56) References Cited

U.S. PATENT DOCUMENTS

| 4,659,392 | A | 4/1987 | Vasudev |
| 4,702,796 | A | 10/1987 | Nakajima et al. |
| 5,099,304 | A | 3/1992 | Takemura et al. |
| 5,258,318 | A | 11/1993 | Buti et al. |
| 5,344,785 | A | 9/1994 | Jerome et al. |
| 5,391,501 | A | 2/1995 | Usami et al. |
| 5,395,789 | A | 3/1995 | Beitman |
| 5,443,661 | A | 8/1995 | Oguro et al. |
| 5,451,541 | A | 9/1995 | Sugiyama |
| 5,478,408 | A | 12/1995 | Mitani et al. |
| 5,559,357 | A | 9/1996 | Krivokapic |
| 5,571,738 | A | 11/1996 | Krivokapic |
| 5,578,518 | A | 11/1996 | Koike et al. |
| 5,585,661 | A | 12/1996 | McLachlan et al. |
| 5,767,563 | A | 6/1998 | Imam et al. |

(Continued)

FOREIGN PATENT DOCUMENTS

| WO | 2005112124 A2 | 11/2005 |
| WO | 2005112124 A3 | 11/2005 |
| WO | 2006050051 A2 | 5/2006 |
| WO | 2006050051 A3 | 6/2006 |

OTHER PUBLICATIONS

Sze, S.M., "VLSI Technology," Bell Telephone Laboratories, Inc., New Jersey, 1983, pp. 111-113.

(Continued)

*Primary Examiner*—Calvin Lee

(57) ABSTRACT

A process of forming an electronic device can include patterning a semiconductor layer to define an opening extending to an insulating layer, wherein the insulating layer lies between a substrate and the semiconductor layer. After patterning a semiconductor layer, the semiconductor layer can have a sidewall and a surface, the surface can be spaced apart from the insulating layer, and the sidewall can extend from the surface towards the insulating layer. The process can also include chemical vapor depositing a first layer adjacent to the sidewall, wherein the first layer lies within the opening and adjacent to the sidewall, and is spaced apart from the surface. Chemical vapor depositing the first layer can be performed using an inductively coupled plasma.

19 Claims, 3 Drawing Sheets

U.S. PATENT DOCUMENTS

| | | |
|---|---|---|
| 5,773,314 A | 6/1998 | Jiang et al. |
| 5,825,696 A | 10/1998 | Hidaka et al. |
| 5,837,612 A | 11/1998 | Ajuria et al. |
| 5,867,420 A | 2/1999 | Alsmeier |
| 5,872,058 A | 2/1999 | Van Cleemput et al. |
| 5,895,253 A | 4/1999 | Akram |
| 5,904,540 A | 5/1999 | Sheng et al. |
| 5,907,771 A | 5/1999 | Ploessl et al. |
| 5,938,885 A | 8/1999 | Huang et al. |
| 5,960,289 A | 9/1999 | Tsui et al. |
| 5,969,401 A | 10/1999 | Hamajima |
| 5,972,758 A | 10/1999 | Liang |
| 5,985,735 A | 11/1999 | Moon et al. |
| 5,989,978 A | 11/1999 | Peidous |
| 6,004,850 A | 12/1999 | Lucas et al. |
| 6,008,526 A | 12/1999 | Kim |
| 6,020,091 A | 2/2000 | Lee |
| 6,033,997 A | 3/2000 | Perng |
| 6,034,388 A | 3/2000 | Brown et al. |
| 6,046,477 A | 4/2000 | Noble |
| 6,054,750 A | 4/2000 | Imam et al. |
| 6,059,877 A | 5/2000 | Bruel |
| 6,071,822 A | 6/2000 | Donohue et al. |
| 6,080,638 A | 6/2000 | Lin et al. |
| 6,091,647 A | 7/2000 | Hidaka et al. |
| 6,096,612 A * | 8/2000 | Houston ............... 438/296 |
| 6,106,678 A | 8/2000 | Shufflebotham et al. |
| 6,110,801 A | 8/2000 | Tsai et al. |
| 6,118,168 A | 9/2000 | Moon et al. |
| 6,121,133 A | 9/2000 | Iyer et al. |
| 6,124,206 A | 9/2000 | Flietner et al. |
| 6,140,207 A | 10/2000 | Lee |
| 6,146,970 A | 11/2000 | Witek et al. |
| 6,150,190 A | 11/2000 | Stankus et al. |
| 6,150,212 A | 11/2000 | Divakaruni et al. |
| 6,150,238 A | 11/2000 | Wu et al. |
| 6,165,906 A | 12/2000 | Bandyopadhyay et al. |
| 6,171,962 B1 | 1/2001 | Karlsson et al. |
| 6,174,784 B1 | 1/2001 | Forbes |
| 6,185,472 B1 | 2/2001 | Onga et al. |
| 6,190,950 B1 | 2/2001 | Noble |
| 6,200,873 B1 | 3/2001 | Schrems et al. |
| 6,215,145 B1 | 4/2001 | Noble |
| 6,238,967 B1 | 5/2001 | Shiho et al. |
| 6,255,171 B1 | 7/2001 | Noble |
| 6,258,676 B1 | 7/2001 | Lee et al. |
| 6,262,468 B1 | 7/2001 | Imam et al. |
| 6,271,143 B1 | 8/2001 | Mendicino |
| 6,277,709 B1 | 8/2001 | Wang et al. |
| 6,288,949 B1 | 9/2001 | Hidaka et al. |
| 6,294,820 B1 | 9/2001 | Lucas et al. |
| 6,300,665 B1 | 10/2001 | Peeters et al. |
| 6,303,413 B1 | 10/2001 | Kalnitsky et al. |
| 6,306,723 B1 | 10/2001 | Chen et al. |
| 6,326,313 B1 | 12/2001 | Couteau et al. |
| 6,333,232 B1 | 12/2001 | Kunikiyo |
| 6,342,733 B1 | 1/2002 | Hu et al. |
| 6,346,732 B1 | 2/2002 | Mizushima et al. |
| 6,350,655 B2 | 2/2002 | Mizuo |
| 6,358,813 B1 | 3/2002 | Holmes et al. |
| 6,368,941 B1 | 4/2002 | Chen et al. |
| 6,385,159 B2 | 5/2002 | Hidaka et al. |
| 6,395,621 B1 | 5/2002 | Mizushima et al. |
| 6,406,962 B1 | 6/2002 | Agnello et al. |
| 6,410,429 B1 | 6/2002 | Ho et al. |
| 6,429,061 B1 | 8/2002 | Rim |
| 6,429,066 B1 | 8/2002 | Brown et al. |
| 6,432,845 B1 * | 8/2002 | Morozumi ............... 438/789 |
| 6,440,817 B2 | 8/2002 | Trivedi |
| 6,452,229 B1 | 9/2002 | Krivokapic |
| 6,465,296 B1 | 10/2002 | Quek et al. |
| 6,479,361 B1 | 11/2002 | Park |
| 6,482,715 B2 | 11/2002 | Park et al. |
| 6,495,430 B1 | 12/2002 | Tsai et al. |
| 6,506,660 B2 | 1/2003 | Holmes et al. |
| 6,506,662 B2 | 1/2003 | Ogura et al. |
| 6,509,234 B1 | 1/2003 | Krivokapic |
| 6,521,510 B1 | 2/2003 | Fisher et al. |
| 6,521,947 B1 | 2/2003 | Ajmera et al. |
| 6,524,929 B1 | 2/2003 | Xiang et al. |
| 6,531,377 B2 | 3/2003 | Knorr et al. |
| 6,534,379 B1 | 3/2003 | Fisher et al. |
| 6,541,382 B1 | 4/2003 | Cheng et al. |
| 6,548,382 B1 | 4/2003 | Henley et al. |
| 6,576,949 B1 | 6/2003 | Park |
| 6,577,522 B2 | 6/2003 | Hidaka et al. |
| 6,580,138 B1 | 6/2003 | Kubena et al. |
| 6,583,440 B2 | 6/2003 | Yasukawa |
| 6,583,488 B1 | 6/2003 | Xiang |
| 6,602,792 B2 | 8/2003 | Hsu |
| 6,613,649 B2 | 9/2003 | Lim et al. |
| 6,617,646 B2 | 9/2003 | Parab |
| 6,632,374 B1 | 10/2003 | Rosa et al. |
| 6,638,799 B2 | 10/2003 | Kotani |
| 6,642,557 B2 | 11/2003 | Liang |
| 6,645,867 B2 | 11/2003 | Dokumaci et al. |
| 6,649,457 B2 | 11/2003 | Hsu |
| 6,653,674 B2 | 11/2003 | Quek et al. |
| 6,656,817 B2 | 12/2003 | Divakaruni et al. |
| 6,657,276 B1 | 12/2003 | Karlsson et al. |
| 6,670,682 B1 | 12/2003 | Mouli |
| 6,687,446 B2 | 2/2004 | Arakawa |
| 6,693,018 B2 | 2/2004 | Kim et al. |
| 6,709,935 B1 | 3/2004 | Yu |
| 6,713,357 B1 | 3/2004 | Wang et al. |
| 6,720,606 B1 | 4/2004 | Nitayama et al. |
| 6,737,345 B1 | 5/2004 | Lin et al. |
| 6,737,706 B2 | 5/2004 | Lee et al. |
| 6,740,933 B2 | 5/2004 | Yoo et al. |
| 6,747,333 B1 * | 6/2004 | Xiang et al. ............... 257/510 |
| 6,753,201 B2 | 6/2004 | Muto et al. |
| 6,764,908 B1 | 7/2004 | Kadosh et al. |
| 6,764,951 B1 | 7/2004 | van Ngo |
| 6,768,662 B2 | 7/2004 | Hidaka et al. |
| 6,780,728 B2 | 8/2004 | Tran |
| 6,787,422 B2 | 9/2004 | Ang et al. |
| 6,791,138 B2 | 9/2004 | Weimer et al. |
| 6,797,323 B1 | 9/2004 | Kashiwagi et al. |
| 6,797,579 B2 * | 9/2004 | Yoo et al. ............... 438/311 |
| 6,798,038 B2 | 9/2004 | Sato et al. |
| 6,803,270 B2 | 10/2004 | Dokumachi et al. |
| 6,812,091 B1 | 11/2004 | Gruening et al. |
| 6,812,115 B2 | 11/2004 | Wieczorek et al. |
| 6,818,482 B1 | 11/2004 | Horch et al. |
| 6,825,529 B2 | 11/2004 | Chidambarrao et al. |
| 6,828,210 B2 | 12/2004 | Kim et al. |
| 6,828,211 B2 | 12/2004 | Chi |
| 6,830,890 B2 | 12/2004 | Lockhart et al. |
| 6,831,292 B2 | 12/2004 | Currie et al. |
| 6,835,997 B1 | 12/2004 | Horch et al. |
| 6,867,433 B2 | 3/2005 | Yeo et al. |
| 6,887,798 B2 | 5/2005 | Deshpande et al. |
| 6,891,271 B2 | 5/2005 | Ebina et al. |
| 6,903,384 B2 | 6/2005 | Hsu et al. |
| 6,955,955 B2 | 10/2005 | Chen et al. |
| 6,973,835 B2 | 12/2005 | Rangsten et al. |
| 6,974,749 B2 | 12/2005 | Lai et al. |
| 6,979,627 B2 | 12/2005 | Yeap et al. |
| 7,037,857 B2 | 5/2006 | Van Gompel et al. |
| 7,230,270 B2 | 6/2007 | Chen et al. |
| 7,268,024 B2 | 9/2007 | Yeo et al. |
| 7,316,981 B2 | 1/2008 | Fucsko et al. |
| 2003/0087506 A1 | 5/2003 | Kirchhoff |
| 2003/0203632 A1 | 10/2003 | Heo et al. |

| | | |
|---|---|---|
| 2003/0209760 A1 | 11/2003 | Maruyama |
| 2004/0135138 A1 | 7/2004 | Hsu et al. |
| 2005/0093067 A1 | 5/2005 | Yeo et al. |
| 2005/0130359 A1 | 6/2005 | Van Gompel et al. |
| 2005/0145937 A1 | 7/2005 | Chen et al. |

OTHER PUBLICATIONS

Wolf, S. et al., "Silicon Processing for the VLSI Era, vol. 1: Process Technology," Lattice Press, California, 1986, pp. 191-193.

U.S. Appl. No. 11/132,936; filed May 19, 2005; Electronic Device Including a Trench Field Isolation Region and a Process for Forming the Same.

U.S. Appl. No. 10/977,266; filed Oct. 29, 2004; Transistor Structure with Dual Trench for Optimized Stress Effect and Method Thereof.

U.S. Appl. No. 10/977,226; filed Jan. 18, 2005; Semiconductor Device Having Trench Isolation for Differential Stress and Method Therefor.

U.S. Appl. No. 11/409,882, Office Action mailed Apr. 10, 2008.

U.S. Appl. No. 11/409,633, Office Action mailed Apr. 2, 2008.

Wolf, S. et al., "Silicon Processing for the VLSI Era, vol. I: Process Technology," Lattice Press, California, 1986, pp. 541 and 546.

Wolf, S. et al., "Isolation Technologies for Integrated Circuits," Silicon Processing for the VLSI Era, vol. 2: Process Integration; Lattice Press, California, 1990, pp. 39-44.

Actions on the Merits by U S P T O, as of Sep. 24, 2008, 7 pgs.

* cited by examiner

PROCESS OF FORMING AN ELECTRONIC DEVICE INCLUDING A LAYER FORMED USING AN INDUCTIVELY COUPLED PLASMA

RELATED APPLICATIONS

The present disclosure is related to U.S. patent application Ser. No. 11/409,633, entitled "Electronic Device Including a Semiconductor Layer and Another Layer Adjacent To an Opening Within The Semiconductor Layer and a Process of Forming the Same" by Van Gompel et. al, filed on Apr. 24, 2006, and U.S. patent application Ser. No. 11/409,882, entitled "Electronic Device Including a Semiconductor Layer and a Sidewall Spacer and a Process of Forming the Same" by Mora et. al. filed on Apr. 24, 2006, all of which are assigned to the current assignee hereof and incorporated by references in their entireties.

BACKGROUND

1. Field of the Disclosure

The present disclosure relates to processes of forming electronic devices, and more particularly to processes of forming electronic devices including layers formed using inductively coupled plasmas.

2. Description of the Related Art

As device performance becomes more and more demanding, semiconductor devices are now formed using semiconductor-on-insulator ("SOI") substrates. In order to achieve a reasonably high component density, field isolation regions are typically formed between semiconductor devices. Typically, a liner layer is formed to help round the top corners of a semiconductor layer to improve gate dielectric integrity.

FIG. 1 includes an illustration of a cross-sectional view of a portion of an electronic device. The electronic device includes a substrate 12, an insulating layer 14, which can be a buried oxide, and a semiconductor layer 162 that overlies the insulating layer 14. The semiconductor layer 162 is patterned to form openings that extend through the semiconductor layer 162 to the insulating layer 14. A thermal oxidation is typically performed and grows a liner layer 164. During the formation of the liner layer 164, top corners 166 of the semiconductor layer 162 are rounded in order to improve gate dielectric integrity. However, the thermal oxidation also causes corner rounding near the bottom of the semiconductor layer 162, as seen with rounded bottom corners 168. The rounded bottom corners 168 within the semiconductor layer 162 near the insulating layer 14 are undesired. An insulating layer 18 can then be formed within the openings, with portions of the insulating layer 18 overlying the semiconductor layer 162 being removed using a conventional process. During subsequent thermal cycles, unacceptable levels of stress may be exerted by the field isolation regions (combination of the liner layer 164 and insulating layer 18) onto the semiconductor layer 162. The stress may cause electrical characteristics of the devices to change, defects, faults, fractures to form within the semiconductor layer 162, or, in extreme cases, delamination of the semiconductor layer 162 from the insulating layer 14.

Another attempt to address the bird's beak has been to form the opening extending through the semiconductor layer 162 and form a nitride layer (not illustrated) along the bottom of the opening and not form any of the nitride layer along the sidewalls of the semiconductor layer 162 near the upper corners 166. In theory, the upper corners 166 of the semiconductor layer 162 should be exposed during a subsequent thermal oxidation, while the lower corners 168 are protected. The nitride layer can be deposited by evaporating the nitride layer, sputtering the nitride layer, or using a thermal chemical vapor technique. In practice, this technique does not work.

Sputtering is characterized by a long mean free path and no significant surface migration. Along the sidewalls, the nitride layer will be thicker at the upper corners 166 and thinner at the lower corners 168, when measured in a direction perpendicular to the sidewalls of the semiconductor layer 162. A collimator can reduce the sidewall deposition, but the deposition would still be thicker at the upper corners 166 as compared to the lower corners 168. Thus, thermal oxidation would round the upper corners 166 and the lower corners 168. Evaporation is more conformal and less directional as compared to sputtering. Therefore, a significant amount of the nitride layer will deposit along the sidewall.

A thermal chemical vapor deposition is a deposition performed without using a plasma. When forming a nitride layer using low pressure chemical vapor deposition ("LPCVD"), dichlorosilane and ammonia are typically reacted at a temperature in a range of approximately 700° C. to approximately 800° C. under vacuum and without a plasma. The deposition is characterized by a rapid surface migration and forms a substantially conformal nitride layer, which would deposit about the same thickness of nitride along the bottom of the opening as it would along the sidewalls of the semiconductor layer 162.

Therefore, a layer having a significant thickness along a bottom of an opening no or very little sidewall coverage while protecting the lower corners 168 while allowing rounding the upper corners 166 of the semiconductor layer 162 has not been enabled. Sputtering and evaporating a nitride layer would deposit a layer along the sidewall that would be locally thicker near the upper corners 166 as compared to the lower corners 168, and a thermal CVD process can produce a conformal layer.

BRIEF DESCRIPTION OF THE DRAWINGS

Embodiments are illustrated by way of example and are not limited in the accompanying figures.

Figure 1:
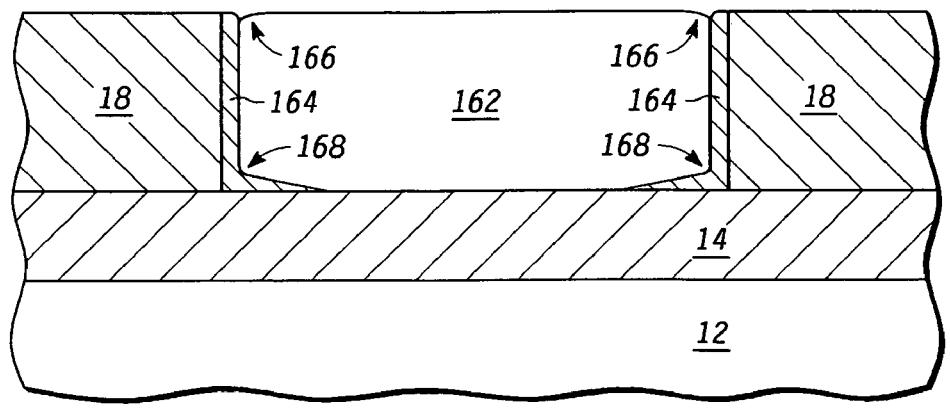
FIG. 1 includes an illustration of a cross-sectional view of a portion of an electronic device that includes an SOI substrate, wherein the semiconductor layer has rounded corners. (Prior Art)

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

A process of forming an electronic device can include patterning a semiconductor layer to define an opening extending to an insulating layer, wherein the insulating layer lies between a substrate and the semiconductor layer. After patterning a semiconductor layer, the semiconductor layer can have a sidewall and a surface, the surface can be spaced apart from the insulating layer, and the sidewall can extend from the surface towards the insulating layer. The process can also include chemical vapor depositing a first layer adjacent to the sidewall, wherein the first layer lies within the opening and adjacent to the sidewall, and is spaced apart from the surface. Chemical vapor depositing the first layer can be performed using an inductively coupled plasma.

Before addressing details of embodiments described below, some terms are defined or clarified. The term "elevation" is intended to mean the closest distance from a layer, a feature, or a surface of a layer or feature to a reference plane, such as a primary surface of a substrate.

The term "high-k" is intended to mean a dielectric constant of at least 8.0.

The term "LPCVD" is intended to mean a chemical vapor deposition performed at pressure less than atmospheric pressure, wherein a reaction between compounds within feed gases is performed without plasma assistance.

The term "PECVD" is intended to mean a chemical vapor deposition performed at pressure less than atmospheric pressure, wherein a reaction between compounds within feed gases is performed with plasma assistance and without significant inductive coupling.

The term "power flux" is intended to mean power per area of a substrate.

The term "primary surface" is intended to mean a surface of a substrate or a layer overlying the substrate or a portion of the substrate or layer from which a transistor is subsequently formed. The primary surface may be an original surface of a base material before forming any electronic components or may be a surface of the semiconductor layer that overlies the base material. For example, an exposed surface of a semiconductor layer of a semiconductor-on-insulator substrate can be a primary surface, and not the original surface of the base material.

The term "substrate" is intended to mean a base material. An example of a substrate includes a quartz plate, a monocrystalline semiconductor wafer, a semiconductor-on-insulator wafer, etc. The reference point for a substrate is the beginning point of a process sequence.

The term "workpiece" is intended to mean a substrate and, if any, one or more layers one or more structures, or any combination thereof attached to the substrate, at any particular point of a process sequence. Note that the substrate may not significantly change during a process sequence, whereas the workpiece significantly changes during the process sequence. For example, at the beginning of a process sequence, the substrate and workpiece are the same. After a layer is formed over the substrate, the substrate has not changed, but now the workpiece includes the combination of the substrate and the layer.

Group numbers corresponding to columns within the Periodic Table of the elements use the "New Notation" convention as seen in the CRC Handbook of Chemistry and Physics, 81$^{st}$ Edition (2000).

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B is true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patent, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

Figure 2:
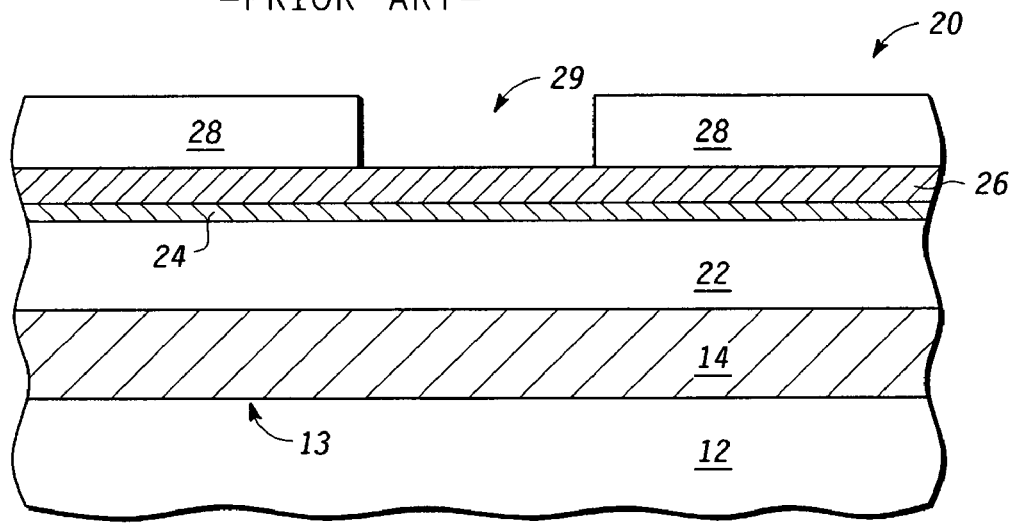
FIG. 2 includes an illustration of a cross-sectional view of a portion of an electronic device workpiece after forming a mask.

FIG. 2 includes an illustration of a cross-sectional view of a portion of an electronic device workpiece 20, which includes a substrate 12, an insulating layer 14, and a semiconductor layer 22. The substrate 12 can include an electronic device substrate, such as a flat panel substrate, a semiconductor device substrate, or another conventional substrate used for forming electronic devices. The insulating layer 14 overlies the substrate 12 at a primary surface 13.

The insulating layer 14 includes an oxide, a nitride, or a combination thereof. The insulating layer 14 (usually referred to as a buried oxide layer or a BOX layer) has a thickness sufficient to substantially reduce parasitic capacitance between the substrate 12 and subsequently formed electronic devices within the semiconductor layer 22. In one embodiment, the insulating layer 14 has a thickness of at least 100 nm.

The semiconductor layer 22 can include a Group 14 element (e.g., C, Si, Ge, etc.), a III-V semiconductor, a II-VI semiconductor, or any combination thereof. In one embodiment, the semiconductor layer 22 is a substantially monocrystalline silicon or silicon germanium layer. The thickness of the semiconductor layer 22 is in a range of approximately 10 to approximately 200 nm. The combination of the substrate 12, insulating layer 14, and semiconductor layer 22 may be obtained from a commercially available source or the insulating layer 14 and semiconductor layer 22 can be formed from or over the substrate 12 using one or more conventional or proprietary processing sequence.

A pad layer 24 and an oxidation-resistant layer 26 are formed over the semiconductor layer 22, as illustrated in FIG. 2. In one embodiment, the pad layer 24 includes an oxide (e.g., silicon dioxide, silicon oxynitride, etc.) that is thermally grown from or deposited over the semiconductor layer 22, and the oxidation-resistant layer 26 includes a nitride (e.g., silicon nitride, silicon-rich silicon nitride, etc.) that is deposited over the pad layer 24. In one non-limiting embodiment, the pad layer 24 can have a thickness in a range of approximately 2 to approximately 40 nm, and the oxidation-resistant layer 26 can have a thickness in a range of approximately 10 to approximately 200 nm.

A mask 28 is formed over the pad layer 24 and the oxidation-resistant layer 26 using a conventional or proprietary lithographic technique to define an opening 29. In one embodiment, the mask 28 includes a resist material, such as photoresist or deep ultraviolet resist.

Figure 3:
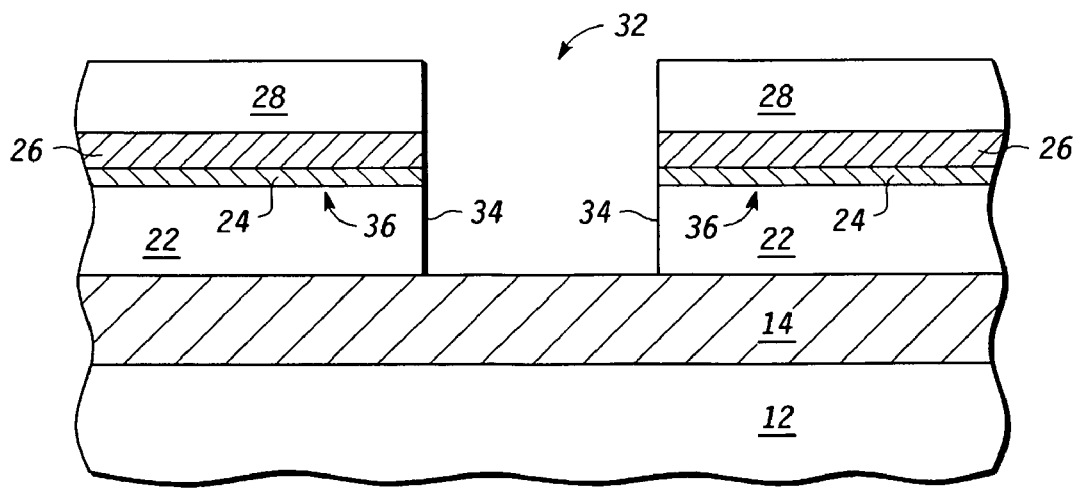
FIG. 3 includes an illustration of a cross-sectional view of the workpiece of FIG. 2 after forming an opening extending through a semiconductor layer.

As illustrated in FIG. 3, the oxidation-resistant layer 26, the pad layer 24, and the semiconductor layer 22 are patterned to form an opening 32 that extends through those layers to expose the insulating layer 14 along a bottom of the opening 32. The semiconductor layer 22 includes surfaces 36 that are spaced apart from the insulating layer 14. After forming the opening 32, the semiconductor layer 22 includes sidewalls 34 lying along the opening 32 and extending from the surfaces 36 towards the insulating layer 14. In one embodiment, the openings in the oxidation-resistant layer 26 and the pad layer 24 and the sidewalls 34 of the opening 32 are substantially coterminous with one another. The sidewalls 34 can be substantially vertical or may include a slight taper (i.e., slightly off vertical).

In one embodiment, the oxidation-resistant layer 26 includes silicon nitride, the pad layer 24 includes silicon dioxide, and the semiconductor layer 22 includes silicon or silicon germanium. The opening 32 can be formed by dry etching the layers. Different etch chemistries can be used during the etch. The oxidation-resistant layer 26 can be etched using an etch chemistry that is tailored for silicon nitride and has good selectivity to oxide. The pad layer 24 can be etched using an etch chemistry that is tailored for silicon dioxide and has good selectivity to silicon or silicon germanium. The semiconductor layer 22 can be etched using an etch chemistry that tailored to silicon or silicon germanium. The same etch chemistries can be used for combinations of some of the layers. For example, the same etch chemistry may be used for the oxidation-resistant layer 26 and pad layer 24. Such etch chemistry may have good selectivity to silicon or silicon germanium. Alternatively, the same etch chemistry may be used for the pad layer 24 and the semiconductor layer 22. Still other etch chemistries can be used, particularly if the composition of the oxidation-resistant layer 26, the pad layer 24, the semiconductor layer 22, or any combination thereof would be different from those previously described. After reading this specification, skilled artisans will be able to select etch chemistries that meet their needs or desires. Each of etching of the oxidation-resistant layer 26, the pad layer 24, and the semiconductor layer 22 may be performed as a timed etch or using endpoint detection with an optional timed overetch.

After the opening 32 has been formed, the mask 28 can be removed using a conventional or proprietary ashing technique. In an alternative embodiment, the mask 28 can be removed after patterning the oxidation-resistant layer 26, after patterning the pad layer 24, or after forming the opening 32. In one embodiment, the oxidation-resistant layer 26 or combination of the oxidation-resistant layer 26 and the pad layer 24 can act as a hard mask while etching the opening 32 into the semiconductor layer 22.

Figure 4:
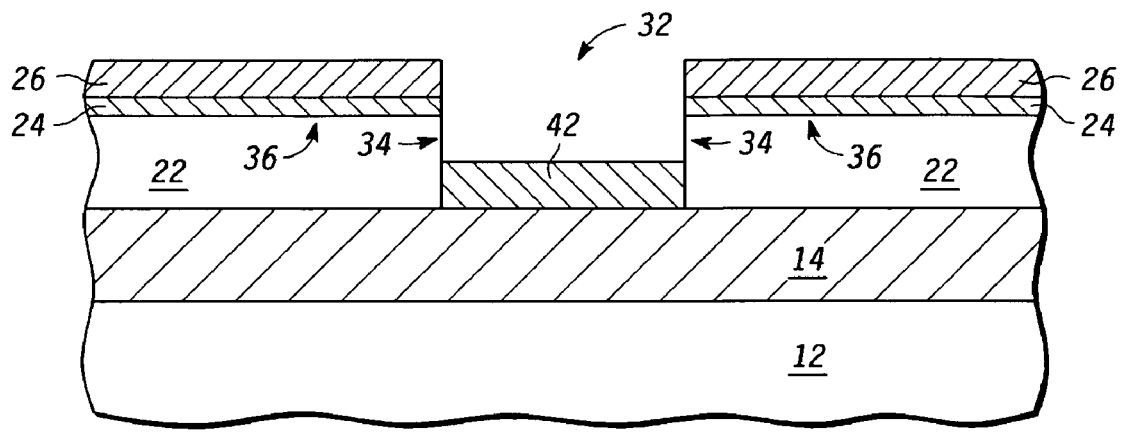
FIG. 4 includes an illustration of a cross-sectional view of the workpiece of FIG. 3 after forming a layer along a bottom of the opening in accordance with an embodiment.

A layer 42 can be formed along the bottom of the opening 32 and along a lower portion of the sidewalls 34 adjacent to the insulating layer 14, but no significant portion of the layer 42 lies along an upper portion of the sidewalls 34 adjacent to the surfaces 36 of the semiconductor layer 22, as illustrated in FIG. 4. In one embodiment, a highest point of the layer 42 lies at an elevation significantly lower than the surfaces 36.

The layer 42 can help to slow or substantially prevent oxidation of the semiconductor layer 22 near the insulating layer 14 during a subsequent thermal oxidation operation. Thus, the material for the layer used to form the sidewall spacers can include a nitride, an oxide, an oxynitride, silicon, germanium, another suitable material used in semiconductor devices and capable of withstanding a processing temperature of at least approximately 1000° C., or any combination thereof. In one embodiment, a nitride layer can be used, and in a particular embodiment, silicon nitride can be used.

The layer 42 can be formed by chemical vapor depositing the layer 42 using an inductively coupled plasma. In a particular embodiment, the layer 42 can be deposited using a high-density plasma. The deposition can be performed in an apparatus, such as a deposition tool, having a chamber. In a non-limiting specific embodiment, an ULTIMA+™-brand deposition tool (cylindrical ionization source) from Applied Materials, Inc. of Santa Clara, Calif., a SPEED-brand deposition tool (hemispherical ionization source) from Novellus Systems, Inc. of San Jose, Calif., or other suitable commercially available system may be used.

The deposition tool can have a chamber that is coupled to two power supplies: an ionizing power supply and a biasing power supply, which can operate at different frequencies. The ionizing power supply can provide power to the chamber at a relatively lower frequency (as compared to the biasing power supply) used in ionizing the feed gases to generate a plasma. The biasing power supply can provide power to the chamber at a relatively higher frequency (as compared to the ionizing power supply) and is used to accelerate ions within the plasma, such that positive ions are accelerated towards the workpiece.

In one embodiment, the ionizing power supply can operate at a frequency of approximately 400 kHz, and the biasing power supply can operate at a frequency of approximately 13.56 MHz. The ionizing power supply provides to the chamber a power flux in a range of approximately 3.2 to approximately 16 watts/cm$^2$. For a 200 mm (nominal) substrate, the ionizing power on the substrate can be in a range of approximately 1000 to approximately 5000 W. In a particular embodiment, the biasing power supply provides no significant power to the chamber, and in another particular embodiment, the biasing power supply provides to the chamber a power flux that is no greater than half the power flux of the ionizing power supply. In still another particular embodiment, the biasing power supply provides to the chamber a power flux that is between 0 watts/cm$^2$ and half the power flux of the ionizing power supply. In a particular embodiment, the biasing power supply provides to the chamber a power flux in a range of approximately 1.6 to approximately 9.6 watts/cm$^2$. For a 200 mm (nominal) substrate, the biasing power on the substrate can be in a range of approximately 500 to approximately 3000 W.

The relatively lower power flux or no significant power from the biasing power supply can help to reduce the amount of deposition along the upper portion of the sidewalls 34 near the surfaces 36 of the semiconductor layer 22. If the biasing power supply would provide too high of a power flux, a portion of the layer 42 lying along the bottom of the opening 32 could become redeposited along the upper portions of the sidewalls 34 near the surfaces 36 of the semiconductor layer 22. The thickness of the layer 42 can be in a range of approximately 10% to approximately 80% of the thickness of the semiconductor layer 22. In one embodiment, the thickness of the layer 42 can be in a range of approximately 20% to approximately 50% of the thickness of the semiconductor layer 22. As long as the exposed surface of the layer 42 lies at a higher elevation than the corners 56 (see FIG. 5), the corners 56 should be sufficiently protected during a subsequent thermal oxidation. If the semiconductor layer 22 has a thickness of approximately 70 nm, the layer 42 can have a thickness in a range of approximately 7 to approximately 63 nm, and in a more particular embodiment, in a range of approximately 15 to approximately 35 nm.

The feed gases used to form the layer 42 can depend on the composition of the layer. For example, if the layer 42 includes silicon nitride, the feed gases can include a silicon-containing gas and a nitrogen-containing gas. If the layer 42 includes silicon dioxide, the feed gases can include a silicon-containing gas and an oxygen-containing gas. The layer 42 may contain another semiconductor element, a metal element, or any combination of semiconductor and metal elements. A corresponding semiconductor-containing gas, metal-containing gas, or any combination thereof can be included within the feed gases. A noble gas (He, Ne, Ar, Xe, Rn, or any combination thereof) can be included in the feed gases as a diluent.

In a non-limiting, particular embodiment, the layer 42 includes silicon nitride. The feed gases can include $Si_yH_zX_{2y+2-z}$, wherein:

X is a halogen (F, Cl, Br, I, or any combination thereof);
y is an integer having a value from 1 to 3; and
z is an integer having a value from 0 to 2y+2.

The feed gases can also include $N_2$, $NH_3$, $N_2H_4$, or any combination thereof. The feed gases can further include a noble gas.

In a more particular embodiment, the feed gases can include $SiH_4$, $N_2$, and He. The ratio of the $N_2$:$SiH_4$ can be in a range of approximately 8:1 to approximately 12:1, and the ratio of He:$SiH_4$ can be in a range of approximately 10:1 to approximately 15:1. Ratios outside the ranges described above can be used. The ratio of $N_2$:$SiH_4$ can be at least approximately 3:1 if silicon nitride is to be formed. If silicon-rich silicon nitride is to be formed, the ratio may be lower. In theory, there is no known upper limit for the $N_2$:$SiH_4$ ratio, and there is no known lower or upper limit for the $N_2$:He ratio. The ratios change if the number of silicon or nitrogen atoms within different molecules is used. For example, if $NH_3$ were used, the ratios above would be doubled; however, if $N_2H_4$ were used, the ratios above would be the same.

The actual gas flow rates of the feed gases can depend on the volume of the chamber. When a 200 mm (nominal) substrate is used, the $SiH_4$ gas flow rate can be in a range of approximately 30 to approximately 50 standard cubic centimeters per minute (sccm), the $N_2$ gas flow rate can be in a range of approximately 300 to approximately 500 sccm, and the He gas flow rate can be in a range of approximately 400 to approximately 600 sccm. After reading this specification, skilled artisans will be able to select the feed gases, determine the ratios of the feed gases, and determine the gas flow rates of the feed gases.

The chemical vapor deposition may be performed at pressure less than approximately 20 mTorr, and in one embodiment, in a range of approximately 1 to approximately 10 mTorr. The relatively low pressure can help to keep the layer 42 from significantly depositing along the upper portions of the sidewalls 34 adjacent to the surfaces 36 of the semiconductor layer 22. The chemical may be performed at a temperature in a range of approximately 200° C. to approximately 500° C., and in a particular embodiment, in a range of approximately 350° C. to approximately 450° C.

To the extent particular deposition parameters are not described (e.g., actual gas flow rates, deposition rates and times, etc.), conventional or proprietary deposition parameters can be used. After reading this specification, skilled artisans will appreciate that different operating parameters could be used for the silicon nitride layer or if a different composition (e.g., silicon oxynitride, etc.) would be deposited.

While many details have been given, after reading this specification, skilled artisans appreciate that deposition parameters may be varied within or outside of the parameters previously given and still produce the layer 42 without a significant portion depositing along the sidewalls 34 near the surfaces 36 of the semiconductor layer 22.

If any of the layer 42 would deposit along the sidewalls 34 adjacent to the surfaces 36 when using any of the parameters as described, a subsequent thermal oxidation may oxide that portion of the layer 42. In one embodiment, no nitride etch is performed between formation of the layer 42 and the subsequent thermal oxidation. In another embodiment, an optional nitride etch could be performed. The etch can be performed using a wet or dry isotropic etching technique. In one embodiment, no more than approximately 20% of the deposited thickness of the layer 42 (as measured along a substantially horizontal surface of the workpiece) is removed, and in a more particular embodiment, no more than approximately 5% of such deposited thickness of the layer 42 is removed. After reading this specification, skilled artisans will be able to determine whether the etch should be performed, and if so, how much of the layer 42 would be removed by the etch.

Figure 5:
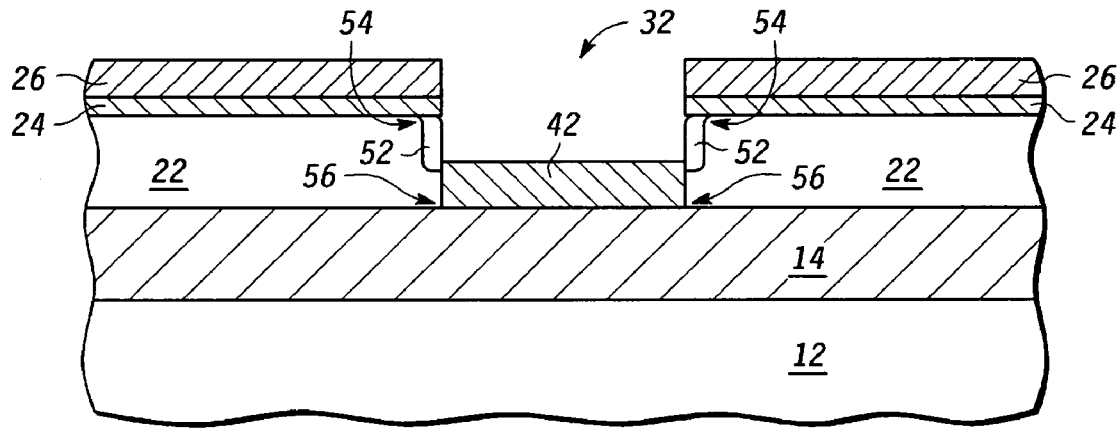
FIG. 5 includes an illustration of a cross-sectional view of the workpiece of FIG. 4 after rounding corners of the semiconductor layer near the top of the semiconductor layer.

A liner layer 52 can be formed along the exposed surfaces of the semiconductor layer 22, as illustrated in FIG. 5. The liner layer 52 can include one or more insulating films. In one embodiment, the liner layer 52 is formed by thermally oxidizing a portion of the semiconductor layer 22 using an oxygen-containing ambient (e.g., $O_2$, $O_3$, $N_2O$, another suitable oxidizing species, or any combination thereof). The oxidation-resistant layer 26 does not significantly oxidize during the thermal oxidation, and therefore can act as an oxidation mask during thermal oxidation. In one embodiment, the liner layer 52 has a thickness in a range of approximately 1 to approximately 20 nm, and in a more particular embodiment, in a range of approximately 7 to approximately 11 nm.

The thermal oxidation can cause corner rounding of semiconductor layer 22, adjacent to the pad layer 24, which results in rounded corners 54. The rounded corners 54 lies at or near the top of the sidewalls 34 of the semiconductor layer 22. The rounded corners 54 help to improve gate dielectric layer integrity. The layer 42 slows or substantially prevents oxidation of the semiconductor layer 22 at the corners 56 adjacent to the insulating layer 14. Thus, the layer 42 allows the liner layer 52 to be thicker than if liner layer 52 was formed when the layer 42 would not be present adjacent to the bottom of the semiconductor layer 22.

In an alternative embodiment, the liner layer 52 can include one or more other insulating films that can be used in conjunction with or in place of the thermal oxide film. In one embodiment, a nitride film can be deposited using a conventional technique over the thermal oxide film. The nitride film can have a thickness in a range of approximately 1 to approximately 5 nm and may help to reduce erosion of the oxide film within the liner layer 52 during subsequent oxide etches, for example, when removing the pad layer 24, when forming and removing a sacrificial layer before forming a gate dielectric layer of the electronic device, etc.

In an alternative embodiment (not illustrated), the layer 42 can optionally be removed at this point in the process. For example, if the layer 42 includes a metallic element, the removal may reduce the likelihood of adverse consequences (due to the presence of the metallic element throughout the remainder of the process sequence).

Figure 6:
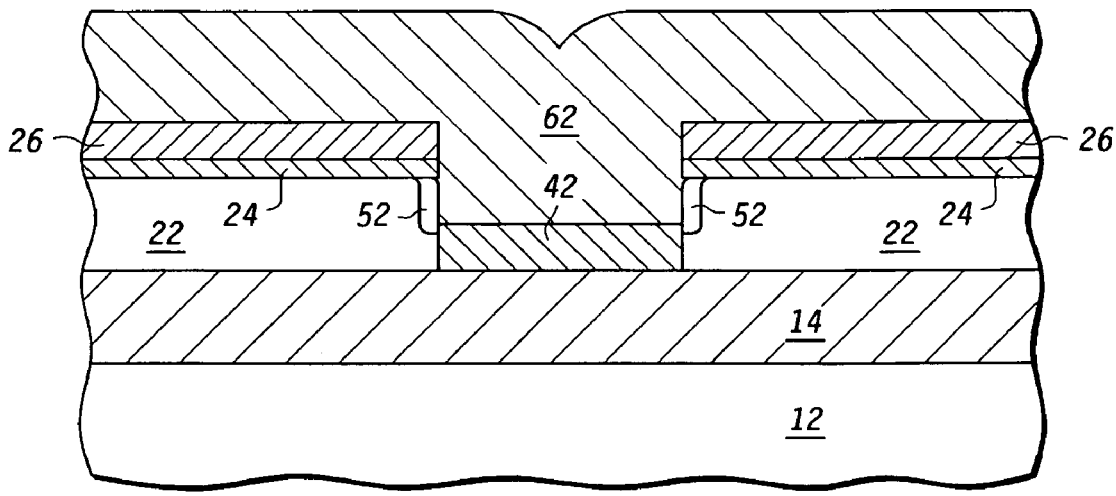
FIG. 6 includes an illustration of a cross-sectional view of the workpiece of FIG. 5 after forming an insulating layer that fills the opening.

An insulating layer 62 is formed and substantially fills the rest of the opening 32, as illustrated in FIG. 6. The insulating layer 62 can include an oxide, a nitride, an oxynitride, or a combination thereof and can be deposited using a conventional or proprietary technique. In one specific embodiment, the insulating layer 62 is formed by depositing an oxide film from tetraethylorthosilicate (TEOS) to a thickness that is at least one half the depth of the opening 32, and typically is as thick as the depth of the opening 32. The insulating layer 62 may have an undulating upper surface, a substantially flat upper surface, or something in-between.

Figure 7:
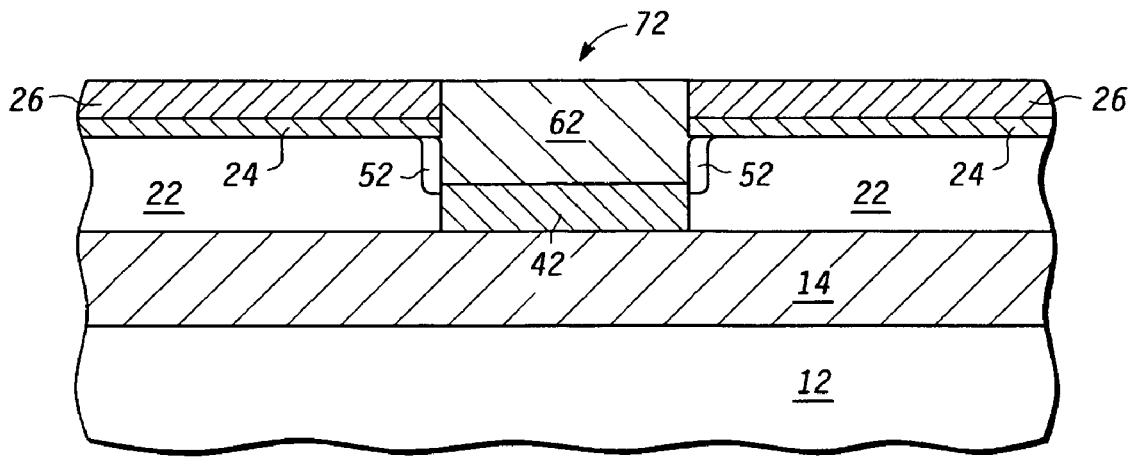
FIG. 7 includes an illustration of a cross-sectional view of the workpiece of FIG. 6 after forming a field isolation region is substantially completed.

Portions of the insulating layer 62 lying outside the opening 32 and overlying the oxidation-resistant layer 26 are removed to form a field isolation region 72, as illustrated in FIG. 7. The field isolation region 72 includes the layer 42, the liner layer 52, and the insulating layer 62. In one embodiment, a conventional or proprietary chemical-mechanical polishing technique can be used, wherein the oxidation-resistant layer 26 can also act as a polish-stop layer. In another embodiment, the polishing operation could be continued until another layer underlying the oxidation-resistant layer 26 is reached.

In another embodiment, a conventional or proprietary etching process can be performed until the oxidation-resistant layer 26 is exposed, wherein the oxidation-resistant layer 26 can also act as an etch-stop layer. The etching may be performed as a timed etch or using endpoint detection (detecting the oxidation-resistant layer 26 has been reached) with a timed overetch. In one particular embodiment when the insulating layer 62 has an undulating surface, as deposited, a conventional or proprietary resist-etch-back process can be used. As the insulating layer 62 is etched, the etch chemistry may be changed before the oxidation-resistant layer 26 is reached to improve the etch selectivity (e.g., ratio of oxide etch rate to nitride etch rate is increased), and thus, decrease the likelihood of removing substantially all of the oxidation-resistant layer 26.

Figure 8:
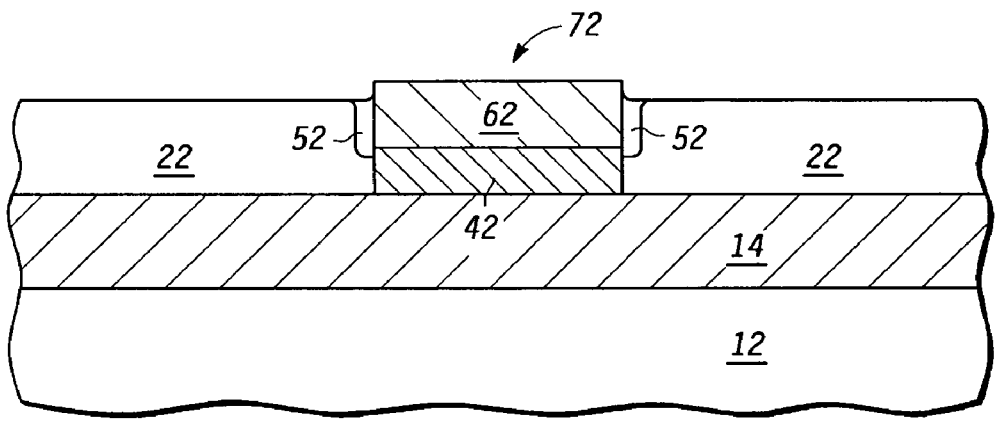
FIG. 8 includes an illustration of a cross-sectional view of the workpiece of FIG. 7 after removing remaining portions of layers overlying the semiconductor layer.

In FIG. 8, remaining portions of the oxidation-resistant layer 26 and the pad layer 24 are removed using a conventional or proprietary technique, if not previously removed when removing portions of the insulating layer 62 that were outside the opening 32. A wet etching technique, dry etching technique, or any combination thereof can be used to remove the oxidation-resistant layer 26, the pad layer 24, or both. In one embodiment, a dilute HF solution can be used to remove the pad layer 24. Relatively small amounts of the liner layer 52 and the insulating layer 62 may be removed if the pad layer 24, the liner layer 52, and the insulating layer 62 comprise substantially the same material (e.g., $SiO_2$). Such relatively small amounts typically do not significantly adversely affect the electronic device.

In another embodiment, not illustrated, a sacrificial oxide layer can be grown and removed at this point in the process. The sacrificial oxide layer can help to improve the surface quality of the semiconductor layer-22 before a gate dielectric layer or another layer is subsequently formed. The thickness of the sacrificial layer can be in a range of approximately 1 to approximately 20 nm. The sacrificial oxide layer may be formed in addition to or instead of the liner layer 52. If the liner layer 52 would not be formed, the sacrificial oxide layer can help to round the upper corners of the semiconductor layer 22 before a gate dielectric layer would be formed. The sacrificial oxide layer can be formed and removed using a conventional or proprietary process.

Figure 9:
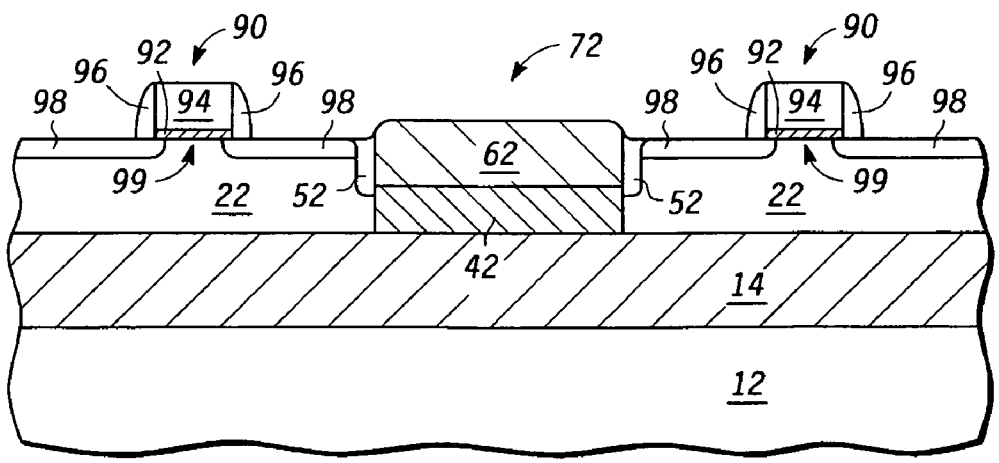
FIG. 9 includes an illustration of a cross-sectional view of the workpiece of FIG. 8 after forming electronic components.

At this point in the process, electronic components, such as transistors 90, can be formed, as illustrated in FIG. 9. In one embodiment, the transistors 90 will have their active regions (i.e., source/drain and channel regions) formed within the semiconductor layer 22. The transistors 90 include an n-channel transistor, a p-channel transistor, or any combination thereof. Other electronic components, including a resistor, a capacitor, or any combination thereof, can be formed from portions of the semiconductor layer 22, if desired.

Optionally, a well dopant (not illustrated), a separate threshold adjust dopant, or other dopants may be introduced into portions of the semiconductor layer 22. An optional thermal cycle may be performed to activate the dopant(s). In another embodiment, the dopant(s) may be activated during subsequent processing.

A gate dielectric layer 92 is formed over the semiconductor layer 22, as illustrated in FIG. 9. The gate dielectric layer 92 can be formed using a conventional or proprietary growth technique, a deposition technique, or any combination thereof. The gate dielectric layer 92 can include one or more films of silicon dioxide, silicon nitride, silicon oxynitride, a metal-containing oxide, a metal-containing nitride, a metal-containing oxynitride, another high-k material, or any combination thereof. The gate dielectric layer 92 can have a thickness in a range of approximately 5 to approximately 50 nm in a substantially completed electronic device. In an alternative embodiment, the transistors 90 may have gate dielectric layers with different compositions, a different number of films within each gate dielectric layer, significantly different thicknesses, or any combination thereof.

Gate electrodes 94 are formed over the gate dielectric layer 92 using a conventional deposition and etch processing sequence. Each of the gate electrodes 94 can include one or more layers. The gate electrodes 94 can include a heavily doped amorphous silicon or polycrystalline silicon layer, a metal-containing layer, another suitable conductive layer, or any combination thereof. Each of the gate electrodes 94 has a thickness in a range of approximately 50 to approximately 300 nm. In an alternative embodiment, the transistors 90 may have gate electrodes with different compositions, a different number of films within each gate electrode, significantly different thicknesses, or any combination thereof.

The gate dielectric layer 92 and the gate electrodes 94 extend into and out of the drawing as illustrated in FIG. 9. Although not illustrated, the gate electrodes 94 may extend over the field isolation region 72 or a different field isolation region that is substantially similar to the field isolation region 72. Thus, each of the gate dielectric layer 92 and the gate electrodes 94 may lie adjacent to the surfaces 36 of the semiconductor layer 22 and adjacent to one or more of the rounded corners 54 of the semiconductor layer 22 (see FIG. 5).

An optional sidewall oxide layer (not illustrated) can be grown from exposed sides of the gate electrodes 94 to protect the gate electrodes 94 during subsequent processing. The thickness of the optional sidewall oxide layer can be in a range of approximately 2 to approximately 15 nm.

Sidewall spacers 96 and source/drain ("S/D") regions 98 can be formed. In one embodiment, dopants for extension regions can be implanted after forming the gate electrodes 94 and before forming the sidewall spacers 96. The sidewall spacers 96 can be formed using conventional deposition techniques and may include an oxide layer, a nitride layer, or a combination thereof. Dopants for heavily doped regions can be implanted after forming the sidewall spacers 96. A thermal cycle can be performed to activate the dopants to form the S/D regions 98, which include extension and heavily doped regions. Portions of the semiconductor layer 22 lying under the gate electrodes 94 and between the S/D regions 98 are channel regions 99. At this point in the process, transistors 90 have been formed. Although not illustrated in FIG. 9, silicided regions can be formed from or over the gate electrodes 94, S/D regions 98, or any combination thereof. The silicided regions can be formed using a conventional or proprietary process.

Processing can be continued to form a substantially completed electronic device. One or more insulating layers, one or more conductive layers, and one or more passivating layers are formed using conventional techniques.

Embodiments as described herein can provide benefits to electronic devices formed using the processes as described herein. The deposition of layer 42 can be performed to substantially prevent deposition of the layer 42 along upper portions of the sidewalls 34 adjacent to the surfaces 36 of the semiconductor layer 22. If any portion of the layer 42 would deposit along the upper portions of the sidewalls 34, such portion would be relatively thin and may be oxidized during the thermal oxidation when forming the rounded corners 54, as illustrated in FIG. 5. Thus, the thickness of the layer 42 is substantially thicker at the corners 56, as compared to the rounded corners 54. The corners 56 are sufficiently protected during the thermal oxidation, while the rounded corners 54 are being formed.

Such benefits would not occur with sputtering, evaporation, or thermal nitride. Even if a collimator is used, the thickness of a sputtered or evaporated layer is thicker near the top of the sidewall than at the bottom of the sidewall. By the time the top of the sidewall is exposed by an etch (before thermal oxidation and corner rounding), the bottom of the sidewall is also exposed. A thermal nitride layer would be conformally deposited, and therefore, the thermal nitride layer would have a substantial thickness of nitride along all of the sidewall after deposition.

After reading this specification, skilled artisans will appreciate that the teachings are not limited to the layer 42 that includes silicon nitride. Oxides or other nitride layers could be formed in place of or in conjunction with a silicon nitride layer.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include patterning a semiconductor layer to define an opening extending to an insulating layer, wherein the insulating layer lies between a substrate and the semiconductor layer. After patterning the semiconductor layer, the semiconductor layer can have a sidewall and a surface, the surface can be spaced apart from the insulating layer, and the sidewall can extend from the surface towards the insulating layer. The process can also include chemical vapor depositing a first layer adjacent to the sidewall, wherein the first layer lies within the opening and adjacent to the sidewall, and is spaced apart from the surface, and chemical vapor depositing the first layer is performed using an inductively coupled plasma.

In one embodiment of the first aspect, chemical vapor depositing can be performed using a chamber coupled to a first power supply and a second power supply. During chemical vapor depositing, the first power supply can provide a first power at a first frequency to the chamber, and the second power supply can provide a second power at a second frequency to the chamber, wherein the first frequency is higher than the second frequency, and the first power is no more than approximately half the second power. In a particular embodiment, chemical vapor depositing can include chemical vapor depositing, wherein the first power supply is a biasing power supply, and the second power supply is an ionizing power supply. In another embodiment, chemical vapor depositing can be performed using a chamber that is coupled to a biasing power supply and an ionizing power supply. During chemical vapor depositing, the biasing power supply may provide substantially no power to the chamber and the ionizing supply can provide a power greater than 0 watts to the chamber.

In still another embodiment of the first aspect, chemical vapor depositing can be performed at a pressure no greater than approximately 20 mTorr. In yet another embodiment, chemical vapor depositing can include chemical vapor depositing the first layer along a bottom of the opening and along the sidewall at a first point adjacent to the insulating layer, but not along the sidewall at a second point adjacent to the surface.

In a further embodiment of the first aspect, the process can further include oxidizing the semiconductor layer. The semiconductor layer can include a first corner and a second corner, wherein the first corner is adjacent to the surface, and the second corner is adjacent to the insulating layer. The first corner can become rounded during oxidizing the semiconductor layer, and the second corner substantially maintains its shape during oxidizing the semiconductor layer. In a particular embodiment, oxidizing the semiconductor layer can include thermally growing an oxide layer from the semiconductor layer, wherein the oxide layer has a thickness less than approximately 20 nm. In another particular embodiment, oxidizing the semiconductor layer can include thermally growing an oxide layer from the semiconductor layer, wherein the oxide layer has a thickness in a range of approximately 6 to approximately 10 nm. In still another particular embodiment, oxidizing the semiconductor layer can be performed using an ambient including $O_2$ and HCl at a temperature in a range of approximately 800° C. to approximately 1150° C.

In yet another particular embodiment of the first aspect, the process can further include depositing an insulating layer that substantially fills the opening, and polishing the insulating layer to remove a portion of the insulating layer lying outside the opening. In a more particular embodiment, the process can further include forming a patterned oxidation-resistant layer over the semiconductor layer before patterning the semiconductor layer, and removing the patterned oxidation-resistant layer after removing the material.

In still a further embodiment of the first aspect, chemical vapor depositing the first layer can include chemical vapor depositing a nitride layer. In yet a further embodiment, chemical vapor depositing can include chemical vapor depositing using feed gases including:

a $Si_yH_zX_{2y+2-z}$, wherein:
X is a halogen (F, Cl, Br, I, or any combination thereof);
y is an integer having a value from 1 to 3; and
z is an integer having a value from 0 to 2y+2; and
$N_2$, $NH_3$, $N_2H_4$, or any combination thereof.

In a particular embodiment of the first aspect, chemical vapor depositing can include chemical vapor depositing using the feed gases that further include a noble gas. In another embodiment, the process can further include forming a gate dielectric layer adjacent to the surface and the first corner of the semiconductor layer, and forming a gate electrode. The gate dielectric layer can lie between the semiconductor layer and the gate electrode, and the gate electrode can lie adjacent to the surface and the first corner of the semiconductor layer.

In a second aspect, a process of forming an electronic device can include forming a patterned oxidation-resistant layer over a semiconductor layer, wherein an insulating layer lies between a substrate and the semiconductor layer. The process can also include patterning the semiconductor layer to define an opening extending to the insulating layer. After patterning the semiconductor layer, the semiconductor layer can have a sidewall and a surface, the surface can be spaced apart from the insulating layer, and the sidewall can extend between the insulating layer and the surface. The process can also include chemical vapor depositing a nitride layer, wherein the nitride layer lies within the opening and adjacent to the sidewall, and is spaced apart from the surface. Chemical vapor depositing can be performed using a chamber that is coupled to a biasing power supply and an ionizing power supply, wherein during chemical vapor depositing, the biasing power supply provides substantially no power to the chamber, and the ionizing supply provides a power greater than 0 watts to the chamber. The process can further include oxidizing the semiconductor layer after chemical vapor depositing the nitride layer. The semiconductor layer can include a first corner and a second corner, wherein the first corner is adjacent to the surface, and the second corner is adjacent to the insulating layer. The first corner can become rounded during oxidizing the semiconductor layer, and the second corner can substantially maintain its shape during oxidizing the semiconductor layer. The process can still further include depositing an oxide layer that substantially fills the opening, polishing the oxide layer to remove a portion of the oxide layer lying outside the opening, and removing the patterned oxidation-resistant layer after removing the portion of the oxide layer. The process can yet further include forming a gate dielectric layer adjacent to the semiconductor layer, and forming a gate electrode. The gate dielectric layer can lie between the semiconductor layer and the gate electrode, and the gate dielectric layer and the gate electrode can be part of an n-channel transistor.

In one embodiment of the second aspect, chemical vapor depositing can be performed using feed gases including $SiH_4$, $N_2$, and He. In another embodiment, chemical vapor depositing the nitride layer can be performed using an inductively coupled plasma. In still another embodiment, forming the gate electrode can be performed such that the gate electrode lies adjacent to the surface and the first corner of the semiconductor layer.

Note that not all of the activities described above in the general description or the examples are required, that a portion of a specific activity may not be required, and that one or more further activities may be performed in addition to those described. Still further, the order in which activities are listed is not necessarily the order in which they are performed.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that a structural substitution, logical substitution, or another change may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed subject matter requires more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
   patterning a semiconductor layer to define an opening extending to an insulating layer,
      wherein the insulating layer lies between a substrate and the semiconductor layer,
      wherein after patterning the semiconductor layer:
         the semiconductor layer has a sidewall and a surface;

the surface is spaced apart from the insulating layer; and the sidewall extends from the surface towards the insulating layer; and chemical vapor depositing a first layer adjacent to the sidewall, wherein:

the first layer lies within the opening and adjacent to the sidewall, and is spaced apart from the surface; and chemical vapor depositing the first layer is performed:
using an inductively coupled plasma;
at a pressure no greater than approximately 20 mTorr;
using a chamber that is coupled to a biasing power supply and an ionizing power supply; and
during chemical vapor depositing, the biasing power supply provides a first power to the chamber at a first power flux no greater than approximately 1.6 watts/cm$^2$, and the ionizing power supply provides a second power to the chamber at a second power flux that is more than double the first power flux.

2. The process of claim 1, wherein during chemical vapor depositing:
the biasing power supply provides the first power at a first frequency;
the ionizing power supply provides the second power at a second frequency; and
the first frequency is higher than the second frequency.

3. The process of claim 2, wherein chemical vapor depositing comprises chemical vapor depositing using He as an only noble gas.

4. The process of claim 1, wherein during chemical vapor depositing:
the first power flux is substantially 0 watts/cm$^2$; and
the second power flux is in a range of approximately 3.2 watt/cm$^2$ to approximately 16 watt/cm$^2$.

5. The process of claim 1, wherein chemical vapor depositing comprises chemical vapor depositing the first layer along a bottom of the opening and along the sidewall at a first point adjacent to the insulating layer, but not along the sidewall at a second point adjacent to the surface.

6. The process of claim 1, further comprising oxidizing the semiconductor layer, wherein:
the semiconductor layer includes a first corner and a second corner;
the first corner is adjacent to the surface, and the second corner is adjacent to the insulating layer;
the first corner becomes rounded during oxidizing the semiconductor layer; and
the second corner substantially maintains its shape during oxidizing the semiconductor layer.

7. The process of claim 6, wherein oxidizing the semiconductor layer comprises thermally growing an oxide layer from the semiconductor layer, wherein the oxide layer has a thickness less than approximately 20 nm.

8. The process of claim 6, wherein oxidizing the semiconductor layer comprises thermally growing an oxide layer from the semiconductor layer, wherein the oxide layer has a thickness in a range of approximately 6 to approximately 10 nm.

9. The process of claim 6, wherein oxidizing the semiconductor layer is performed using an ambient including O$_2$ and HCl at a temperature in a range of approximately 800° C. to approximately 1150° C.

10. The process of claim 6, further comprising:
depositing an insulating layer that substantially fills the opening; and
polishing the insulating layer to remove a portion of the insulating layer lying outside the opening.

11. The process of claim 10, further comprising:
forming a patterned oxidation-resistant layer over the semiconductor layer before patterning the semiconductor layer; and
removing the patterned oxidation-resistant layer after polishing the insulating layer.

12. The process of claim 1, wherein chemical vapor depositing the first layer comprises chemical vapor depositing a nitride layer.

13. The process of claim 1, wherein chemical vapor depositing comprises chemical vapor depositing using feed gases including:
a $Si_yH_2X_{2y+2-z}$, wherein:
X is a halogen (F, Cl, Br, I, or any combination thereof);
y is an integer having a value from 1 to 3; and
z is an integer having a value from 0 to 2y+2; and
$N_2$, $NH_3$, $N_2H_4$, or any combination thereof.

14. The process of claim 13, wherein chemical vapor depositing comprises chemical vapor depositing using the feed gases that further include He.

15. The process of claim 1, further comprising:
forming a gate dielectric layer adjacent to the surface and the first corner of the semiconductor layer; and
forming a gate electrode, wherein:
the gate dielectric layer lies between the semiconductor layer and the gate electrode; and
the gate electrode lies adjacent to the surface and the first corner of the semiconductor layer.

16. A process of forming an electronic device comprising:
forming a patterned oxidation-resistant layer over a semiconductor layer, wherein an insulating layer lies between a substrate and the semiconductor layer;
patterning the semiconductor layer to define an opening extending to the insulating layer, wherein after patterning the semiconductor layer:
the semiconductor layer has a sidewall and a surface;
the surface is spaced apart from the insulating layer; and
the sidewall extends between the insulating layer and the surface;
chemical vapor depositing a nitride layer, wherein:
the nitride layer lies within the opening and adjacent to the sidewall, and is spaced apart from the surface; and
chemical vapor depositing is performed using a chamber that is coupled to a biasing power supply and an ionizing power supply, wherein during chemical vapor depositing:
the biasing power supply provides substantially no power to the chamber; and
the ionizing supply provides a power greater than 0 watts to the chamber;
oxidizing the semiconductor layer after chemical vapor depositing the nitride layer, wherein:
the semiconductor layer includes a first corner and a second corner;
the first corner is adjacent to the surface, and the second corner is adjacent to the insulating layer;
the first corner becomes rounded during oxidizing the semiconductor layer; and
the second corner substantially maintains its shape during oxidizing the semiconductor layer;
depositing an oxide layer that substantially fills the opening;

polishing the oxide layer to remove a portion of the oxide layer lying outside the opening;

removing the patterned oxidation-resistant layer after removing the portion of the oxide layer;

forming a gate dielectric layer adjacent to the semiconductor layer; and forming a gate electrode, wherein:
- the gate dielectric layer lies between the semiconductor layer and the gate electrode; and
- the gate dielectric layer and the gate electrode are part of an n-channel transistor.

17. The process of claim 16, wherein chemical vapor depositing is performed using feed gases including $SiH_4$, $N_2$, and He.

18. The process of claim 16, wherein chemical vapor depositing the nitride layer is performed using an inductively coupled plasma.

19. The process of claim 16, wherein chemical vapor depositing the nitride layer is performed:
- at a pressure no greater than about 20 mTorr;
- such that the ionizing supply provides the power in a range of approximately 3000 watts to approximately 5000 watts;
- using He as an only noble gas; and
- such that the nitride layer is formed to a thickness that is approximately 33% to approximately 80% of a thickness of the semiconductor layer.

* * * * *

UNITED STATES PATENT AND TRADEMARK OFFICE
CERTIFICATE OF CORRECTION

PATENT NO. : 7,491,622 B2
APPLICATION NO. : 11/409790
DATED : February 17, 2009
INVENTOR(S) : Turner et al.

It is certified that error appears in the above-identified patent and that said Letters Patent is hereby corrected as shown below:

Column 9, Line 66, Please change "layer-22" to --layer 22--

Column 16, Line 18, Please change "$Si_yH_2X_{2y+2-z}$" to --$Si_yH_zX_{2y+2-z}$--

Signed and Sealed this

Twenty-seventh Day of April, 2010

David J. Kappos
*Director of the United States Patent and Trademark Office*